United States Patent
Okuda et al.

(10) Patent No.: US 12,476,033 B2
(45) Date of Patent: Nov. 18, 2025

(54) TRANSMISSION LINE COMPONENT AND ELECTRONIC DEVICE

(71) Applicant: Murata Manufacturing Co., Ltd., Nagaokakyo (JP)

(72) Inventors: Noriaki Okuda, Nagaokakyo (JP); Kosuke Nishio, Nagaokakyo (JP); Tomohiro Nagai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 863 days.

(21) Appl. No.: 17/740,799

(22) Filed: May 10, 2022

(65) Prior Publication Data
US 2022/0270804 A1    Aug. 25, 2022

Related U.S. Application Data

(63) Continuation of application No. PCT/JP2021/000712, filed on Jan. 12, 2021.

(30) Foreign Application Priority Data

Jan. 23, 2020  (JP) .................................. 2020-008881
Sep. 18, 2020  (JP) .................................. 2020-157277

(51) Int. Cl.
*H01F 27/06* (2006.01)
*H01F 17/00* (2006.01)
(Continued)

(52) U.S. Cl.
CPC ............. *H01F 27/06* (2013.01); *H01F 17/00* (2013.01); *H05K 1/0242* (2013.01); *H05K 1/16* (2013.01); *H01F 2017/0093* (2013.01)

(58) Field of Classification Search
CPC .. H01F 27/06; H01F 17/00; H01F 2017/0093; H05K 1/0242; H05K 1/16
See application file for complete search history.

(56) References Cited

U.S. PATENT DOCUMENTS

2012/0269522 A1* 10/2012 Kagaya .................. H05K 1/025
                                                    333/204
2015/0294781 A1* 10/2015 Yosui ...................... H01F 27/29
                                                    333/185
(Continued)

FOREIGN PATENT DOCUMENTS

JP    2000277335 A    10/2000
JP    2005302810 A    10/2005
(Continued)

OTHER PUBLICATIONS

International Search Report in PCT/JP2021/000712, mailed Mar. 30, 2021, 3 pages.
(Continued)

*Primary Examiner* — Malcolm Barnes
(74) *Attorney, Agent, or Firm* — Keating & Bennett, LLP

(57) ABSTRACT

A transmission line component includes an insulation substrate, signal line conductors, and a common-mode choke coil. The insulation substrate is made of a flexible material, and has a shape extending in a first direction. The signal line conductors are on or in the insulation substrate, and extend mainly in the first direction. The common-mode choke coil includes linear conductors on or in the insulation substrate, and is connected to the signal line conductors. The insulation substrate includes a first signal line portion in which the signal line conductors are provided, and a coil portion in which the common-mode choke coil is provided in the first direction. The insulation substrate includes a bent portion in the first signal line portion.

23 Claims, 11 Drawing Sheets

(51) Int. Cl.
*H05K 1/02* (2006.01)
*H05K 1/16* (2006.01)

(56) References Cited

U.S. PATENT DOCUMENTS

2017/0367181 A1* 12/2017 Baba .................... H05K 3/4632
2018/0151951 A1*  5/2018 Ikemoto ................ H05K 1/181
2019/0350090 A1   11/2019 Yonemori et al.

FOREIGN PATENT DOCUMENTS

| JP | 2006332302 A | 12/2006 | | |
|---|---|---|---|---|
| JP | 2014143233 A | 8/2014 | | |
| WO | 2017018134 A1 | 2/2017 | | |
| WO | 2017098921 A1 | 6/2017 | | |
| WO | WO-2018139046 A1 * | 8/2018 | ........... | H05K 1/0306 |
| WO | WO-2018151134 A1 * | 8/2018 | ........... | H05K 1/0231 |

OTHER PUBLICATIONS

Written Opinion in PCT/JP2021/000712, mailed mailed Mar. 30, 2021, 3 pages.

\* cited by examiner

TRANSMISSION LINE COMPONENT AND ELECTRONIC DEVICE

CROSS REFERENCE TO RELATED APPLICATIONS

This application claims the benefit of priority to Japanese Patent Application No. 2020-157277 filed on Sep. 18, 2020 and Japanese Patent Application No. 2020-008881 filed on Jan. 23, 2020, and is a Continuation Application of PCT Application No. PCT/JP2021/000712 filed on Jan. 12, 2021. The entire contents of each application are hereby incorporated herein by reference.

BACKGROUND OF THE INVENTION

1. Field of the Invention

The present invention relates to a transmission line component in which a plurality of line conductors to transmit radio frequency (RF) signals and a common-mode choke coil are provided on or in a substrate.

2. Description of the Related Art

A flat cable with a filter described in Japanese Unexamined Patent Application Publication No. 2006-332302 includes a substrate main body, two signal lines defining differential lines, and a common-mode choke coil.

The two signal lines are defined by linear conductor patterns arranged in parallel, and are formed on one surface of the substrate main body.

The common-mode choke coil is mounted on the surface of the substrate main body, and includes a housing and mounting terminals formed at two ends of the housing. The mounting terminals of the common-mode choke coil are joined to the conductor patterns forming the two signal lines.

In the configuration described in Japanese Unexamined Patent Application Publication No. 2006-332302, for example, if the substrate main body is bent, stress due to the bending is applied to the joints of the mounting terminals of the common-mode choke coil and the conductor patterns. This often causes defects of the joints. Defects of the joints include peeling of the joints, cracks in the joints, and the like. Due to such defects of the joints, mismatching may occur in the differential lines.

SUMMARY OF THE INVENTION

Preferred embodiments of the present invention provide transmission line components that are each able to reduce or prevent an occurrence of defects of differential lines caused by bending stress.

A transmission line component according to a preferred embodiment of the present invention includes a substrate, a first signal conductor, a second signal conductor, and a common-mode choke coil. The substrate has a shape extending in a first direction in which a radio frequency signal is transmitted, and includes an insulating material. The first signal conductor and the second signal conductor are on or in the substrate. The common-mode choke coil includes a coupling between the first signal conductor and the second signal conductor. The substrate includes a coil portion in which the common-mode choke coil is provided, and a signal line portion in which the coupling between the first signal conductor and the second signal conductor is weaker than the common-mode choke coil. The signal line portion includes a bent portion that is bent in a thickness direction of the substrate.

In this configuration, the bent portion where the substrate bends in the thickness direction is located in the signal line portion. Therefore, bending stress is less likely to be applied to the connection areas of the signal conductors in the coil portion and the signal conductors in the signal line portion.

According to preferred embodiments of the present invention, the occurrence of defects of differential lines caused by bending stress is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

First Preferred Embodiment

Figure 1A:
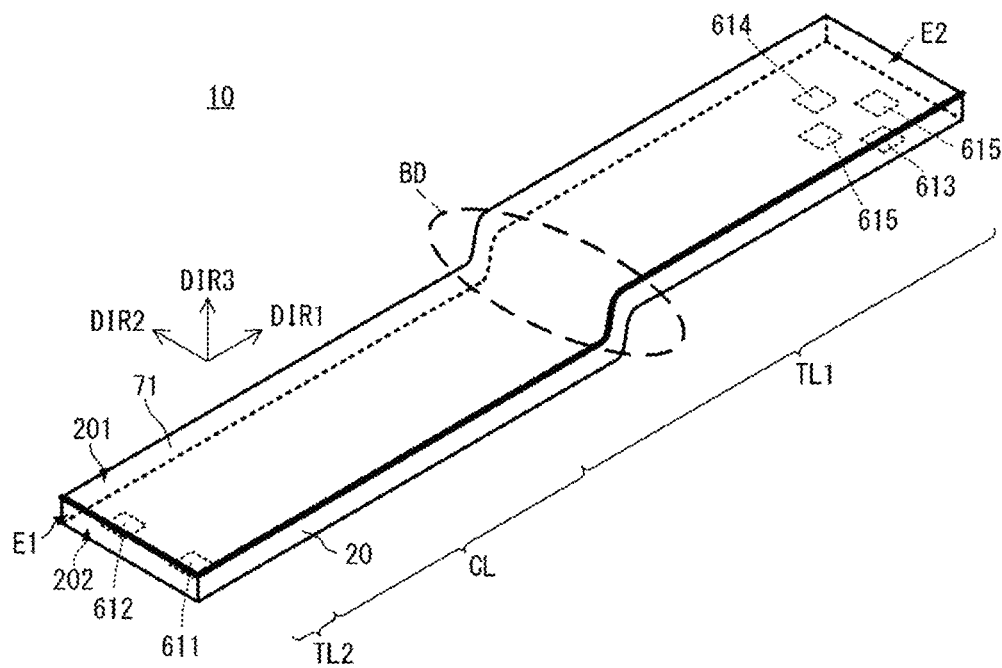
FIG. 1A is an external perspective view.
Figure 1B:
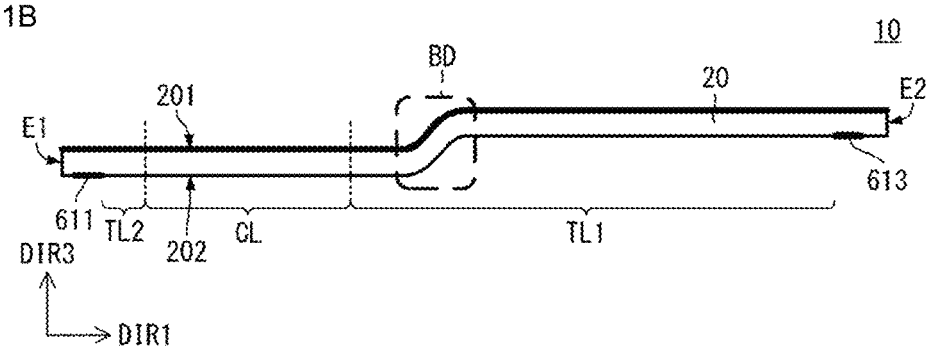
FIGS. 1B and 1C are lateral views of a transmission line component according to a first preferred embodiment of the present invention.
Figure 1C:
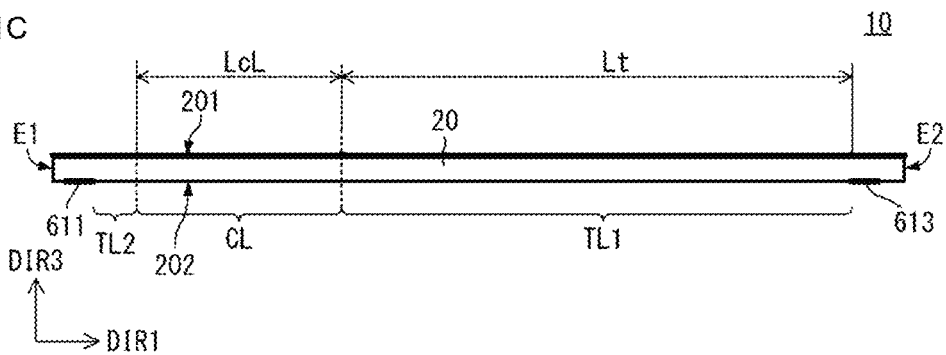
Figure 2:
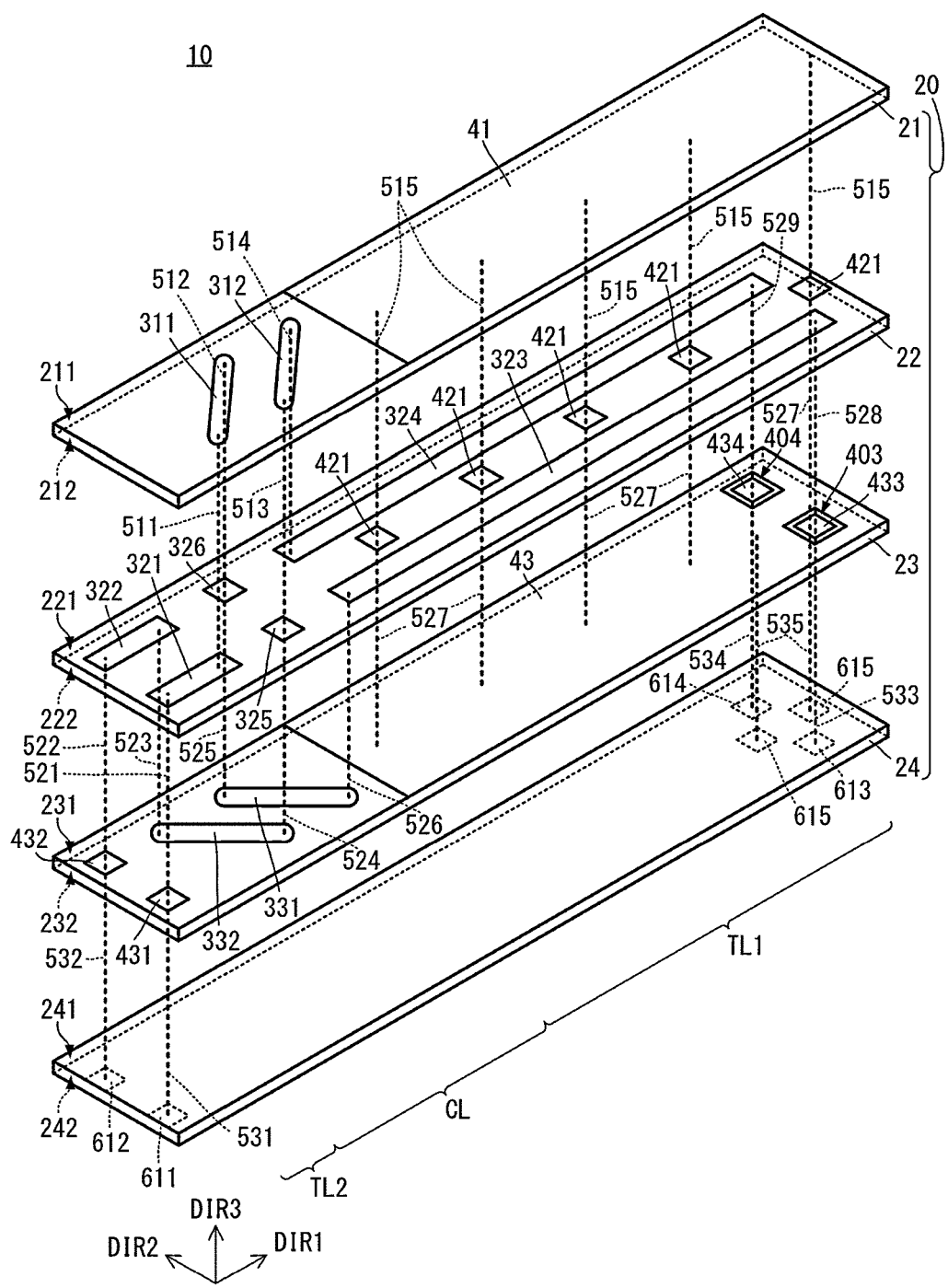
FIG. 2 is an exploded perspective view of the transmission line component according to the first preferred embodiment of the present invention.
Figure 3A:
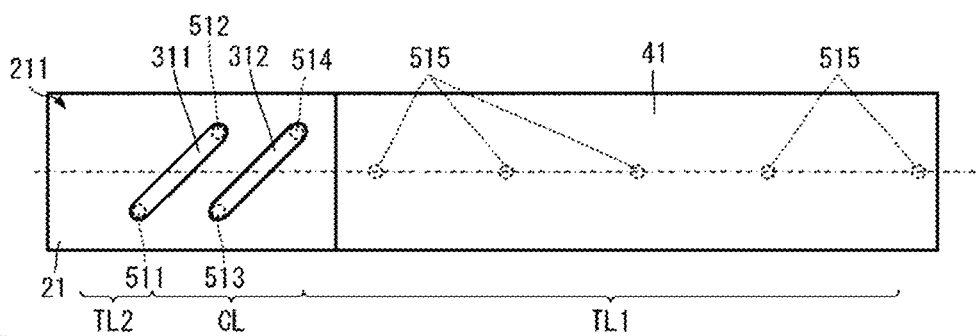
FIGS. 3A to 3D are plan views of each of layers forming the transmission line component according to the first preferred embodiment of the present invention.
Figure 3B:
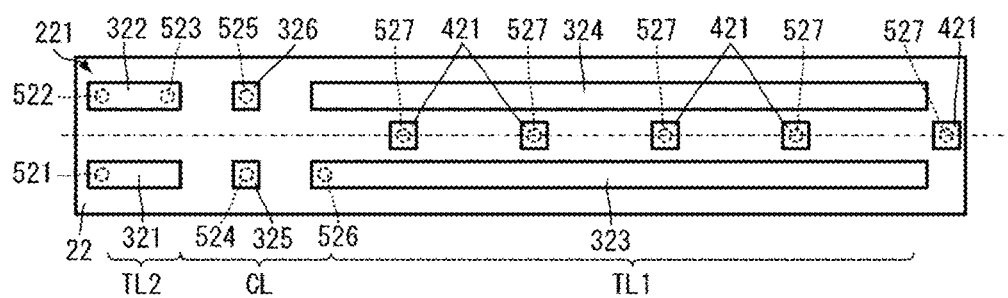
Figure 3C:
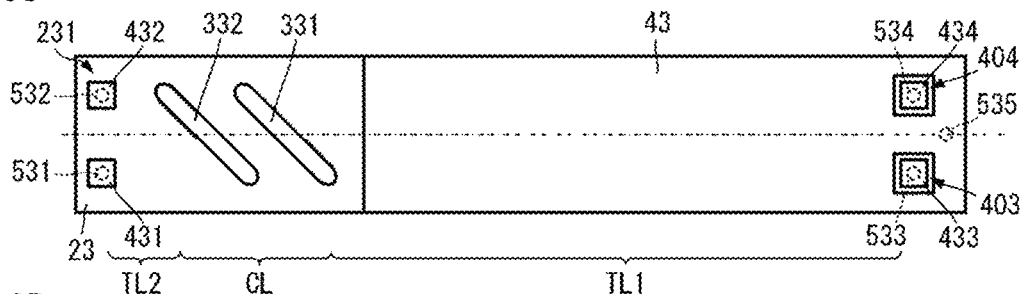
Figure 3D:
Figure 4:
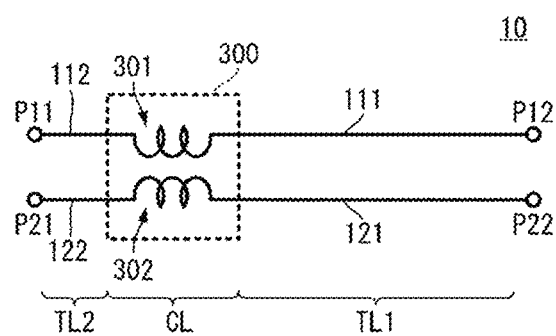
FIG. 4 is an equivalent circuit diagram of the transmission line component according to the first preferred embodiment of the present invention.

FIG. 1A is an external perspective view, and FIGS. 1B and 1C are lateral views of a transmission line component according to a first preferred embodiment of the present invention. FIG. 2 is an exploded perspective view of the transmission line component according to the first preferred embodiment. FIGS. 3A to 3D are plan views of each of layers of the transmission line component according to the first preferred embodiment. FIGS. 3A to 3C each illustrate a surface on a first main surface side, and FIG. 3D illustrates a surface on a second main surface side. FIG. 4 is an equivalent circuit diagram of the transmission line component according to the first preferred embodiment. FIGS. 1A and 1B illustrate a state in which a bent portion is provided, and FIG. 1C, FIG. 2 and, FIGS. 3A to 3D illustrate a state before the bent portion is provided (a state in which there is no bent portion) in order to simplify the structure.

Circuit Configuration

First, the circuit configuration of a transmission line component 10 according to the first preferred embodiment will be described. As illustrated in FIG. 4, the transmission line component 10 includes a signal line 111, a signal line 112, a signal line 121, a signal line 122, a common-mode choke coil 300, an external connection terminal P11, an external connection terminal P12, an external connection terminal P21, and an external connection terminal P22.

The signal line 111 is connected to the external connection terminal P12 and the common-mode choke coil 300. The signal line 112 is connected to the external connection terminal P11 and the common-mode choke coil 300. The signal line 111 corresponds to a first signal conductor.

The signal line 121 is connected to the external connection terminal P22 and the common-mode choke coil 300. The signal line 122 is connected to the external connection terminal P21 and the common-mode choke coil 300. The signal line 121 corresponds to a second signal conductor.

The external connection terminal P11 and the external connection terminal P21 define a first terminal pair. The external connection terminal P12 and the external connection terminal P22 define a second terminal pair.

The signal line 111, the signal line 112, the signal line 121, and the signal line 122 transmit RF signals. Specifically, a set of the signal line 111 and the signal line 121 and a set of the signal line 112 and the signal line 122 transmit differential signals. A portion of the transmission line component 10 where the signal line 111 and the signal line 121 are provided is a first signal line portion TL1. A portion of the transmission line component 10 where the signal line 112 and the signal line 122 are provided is a second signal line portion TL2.

The common-mode choke coil 300 includes a coil 301 and a coil 302. The coil 301 and the coil 302 are arranged so as to be electromagnetically coupled to each other. A portion of the transmission line component 10 where the common-mode choke coil 300 is provided is a coil portion CL.

Differential signals are input from the first terminal pair of the external connection terminal P11 and the external connection terminal P21, transmitted through the signal line 112 and the signal line 122 in the second signal line portion TL2, transmitted through the signal line 111 and the signal line 121 in the first signal line portion TL1 after going through the common-mode choke coil 300 in the coil portion CL, and output from the second terminal pair of the external connection terminal P12 and the external connection terminal P22. The transmission direction of differential signal may be an opposite direction.

With the above-described configuration, the transmission line component 10 transmits differential signals between the first terminal pair and the second terminal pair, and reduces or prevents common-mode noise included in the differential signals using the common-mode choke coil 300.

Schematic Structure

As illustrated in FIGS. 1A to 1C, and FIG. 2, the transmission line component 10 includes an insulation substrate 20 and a protective film 71. The insulation substrate 20 has a rectangular or substantially rectangular shape extending in a first direction DIR1 and a second direction DIR2 orthogonal or substantially orthogonal to each other. The first direction DIR1 is a direction parallel or substantially parallel to a direction in which the signal line 111, the signal line 112, the signal line 121, and the signal line 122 of the transmission line component 10 extend. The second direction DIR2 is a direction orthogonal or substantially orthogonal to the first direction DIR1 and a third direction (thickness direction) DIR3.

Specifically, for example, the insulation substrate 20 has a shape that is longer in the first direction DIR1 than in the second direction DIR2. A first end in the first direction DIR1 of the insulation substrate 20 is a first end portion E1 of the insulation substrate 20, and a second end on the opposite side of the first end portion E1 in the first direction DIR1 is a second end portion E2. The insulation substrate 20 includes a first main surface 201 and a second main surface 202 parallel or substantially parallel to the first direction DIR1 and the second direction DIR2. The first main surface 201 and the second main surface 202 are spaced apart from each other in the third direction (thickness direction) DIR3, which is orthogonal or substantially orthogonal to the first direction DIR1 and the second direction DIR2, and face each other.

On the second main surface 202 of the insulation substrate 20, an external terminal conductor 611, an external terminal conductor 612, an external terminal conductor 613, an external terminal conductor 614, and external terminal conductors 615 are provided.

The external terminal conductor 611, the external terminal conductor 612, the external terminal conductor 613, the external terminal conductor 614, and the external terminal conductors 615 are rectangular or substantially rectangular conductor patterns. The external terminal conductor 611 and the external terminal conductor 612 are provided near the first end portion E1, and the external terminal conductor 613, the external terminal conductor 614, and the external terminal conductors 615 are provided near the second end portion E2. In terms of circuitry, the external terminal conductor 611 corresponds to the external connection terminal P11, and the external terminal conductor 612 corresponds to the external connection terminal P21. Similarly, in terms of circuitry, the external terminal conductor 613 corresponds to the external connection terminal P12, and the external terminal conductor 614 corresponds to the external connection terminal P22. In addition, in terms of circuitry, the external terminal conductors 615 correspond to terminals for grounding (ground connection terminals).

The common-mode choke coil 300, the signal line 111, the signal line 112, the signal line 121, and the signal line 122 described above are provided on or in the insulation substrate 20, as illustrated in FIG. 2 and FIGS. 3A to 3D, whose specific configuration will be described later. The signal line 111, the signal line 112, the signal line 121, and the signal line 122 are provided on the same or substantially the same plane. At this time, the common-mode choke coil 300 is provided at a position closer to the first end portion E1 than to the second end portion E2.

Furthermore, a length Lt of the first signal line portion TL1 is longer than a length LcL of the coil portion CL in dimensions along the first direction DIR1. As illustrated in FIGS. 1A and 1B, in the case where the insulation substrate 20 includes a bent portion BD, the bent portion BD is provided inside the first signal line portion TL1. Note that the bent portion BD is, for example, as illustrated in FIGS. 1A and 1B, a portion where the insulation substrate 20 bends in a direction (third direction DIR3) orthogonal or substantially orthogonal to the first main surface 201 and the second main surface 202.

Because of the fact that the first signal line portion TL1 is longer than the coil portion CL, the bent portion BD may be easily provided in the first signal line portion TL1. In addition, a region providing the bent portion BD in the first direction DIR1 of the transmission line component 10 becomes wider, thus improving the degree of freedom of design.

With the above-described configuration, bending stress due to the bent portion BD and stress that occurs when forming the bent portion BD are less likely to be applied to connection areas (joints) of the common-mode choke coil 300 with the signal line 111 and the signal line 121. Accordingly, the occurrence of breakage or partial cracks in the connection areas (joints) is reduced or prevented. Therefore, the transmission line component 10 may reduce or prevent the occurrence of defects of differential lines caused by bending stress due to the bent portion BD.

The bent portion BD as described above may be easily provided by making the insulation substrate 20 with a flexible material. More specifically, the bent portion BD may be easily provided by using, for example, a thermoplastic resin as the main material of the insulation substrate 20. A non-limiting example of a process is as follows. The insulation substrate 20 whose main material is a thermoplastic resin is held between a mold that molds the bent portion BD, and is heated and pressed. Accordingly, the insulation substrate 20 is plastically deformed to form the bent portion BD.

Note that the position of the bent portion BD in the first direction DIR1 is not limited to the illustrated position as long as the bent portion BD is inside the first signal line portion TL1, and the bending direction is not limited to the illustrated direction.

The protective film 71 is provided on the first main surface 201 of the insulation substrate 20. The protective film 71 covers the entire or substantially the entire surface of the first main surface 201. Note that the protective film 71 may be made of anything as long as it has flexibility.

In addition, the protective film 71 may be omitted. In addition, a protective film may be provided on the second main surface 202.

Internal Structure

A more specific exemplary structure of the transmission line component 10 is as illustrated in FIG. 2, FIGS. 3A to 3D.

As illustrated in FIG. 2 and FIGS. 3A to 3D, the insulation substrate 20 is a multilayer body including an insulator layer 21, an insulator layer 22, an insulator layer 23, and an insulator layer 24. The insulator layer 21, the insulator layer 22, the insulator layer 23, and the insulator layer 24 are made of a flexible material, and it is preferable to use, for example, a thermoplastic resin as the material. For example, the main material of the insulator layer 21, the insulator layer 22, the insulator layer 23, and the insulator layer 24 is a liquid crystal polymer or the like.

The insulator layer 21 is a flat film including a main surface 211 and a main surface 212. The main surface 211 corresponds to the first main surface 201 of the insulation substrate 20. On the main surface 211 of the insulator layer 21, a linear conductor 311, a linear conductor 312, and a ground conductor 41 are provided.

The linear conductor 311 and the linear conductor 312 are provided closer to the first end portion E1 than to the second end portion E2. The linear conductor 311 and the linear conductor 312 have a shape extending along an angle that is neither orthogonal nor parallel to both the first direction DIR1 and the second direction DIR2. The linear conductor 311 and the linear conductor 312 are parallel or substantially parallel to each other.

The ground conductor 41 is a rectangular or substantially rectangular conductor, and is provided on the entire or substantially the entire surface of the first signal line portion TL1 on the main surface 211 of the insulator layer 21.

In the insulator layer 21, an interlayer connection conductor 511, an interlayer connection conductor 512, an interlayer connection conductor 513, an interlayer connection conductor 514, and a plurality of interlayer connection conductors 515 are provided. The interlayer connection conductor 511, the interlayer connection conductor 512, the interlayer connection conductor 513, the interlayer connection conductor 514, and the plurality of interlayer connection conductors 515 penetrate the insulator layer 21 between the main surface 211 and the main surface 212 (penetrate in the thickness direction).

The insulator layer 22 is a flat film including a main surface 221 and a main surface 222. The main surface 221 of the insulator layer 22 abuts on the main surface 212 of the insulator layer 21. On the main surface 221 of the insulator layer 22, a wiring conductor 321, a wiring conductor 322, a signal line conductor 323, a signal line conductor 324, an auxiliary conductor 325, an auxiliary conductor 326, and a plurality of ground auxiliary conductors 421 are provided.

The wiring conductor 321 and the wiring conductor 322 are provided near the first end portion E1, and define the second signal line portion TL2. The wiring conductor 321 and the wiring conductor 322 have a shape extending in parallel or substantially in parallel to the first direction DIR1, and are spaced apart from each other along the second direction DIR2.

The signal line conductor 323 and the signal line conductor 324 define the first signal line portion TL1. The signal line conductor 323 and the signal line conductor 324 have a shape extending in parallel or substantially in parallel to the first direction DIR1, and are spaced apart from each other along the second direction DIR2. More specifically, the signal line conductor 323 and the signal line conductor 324 extend over the entire or substantially the entire length in the first direction DIR1 of a signal line portion ReTL. The signal line conductor 323 and the signal line conductor 324 face each other in the thickness direction of the insulation substrate 20.

The auxiliary conductor 325, the auxiliary conductor 326, and the plurality of ground auxiliary conductors 421 are rectangular or substantially rectangular conductors in plan view. The auxiliary conductor 325 and the auxiliary conductor 326 define a portion of the coil portion CL. In the first direction DIR1, the auxiliary conductor 325 is provided between the wiring conductor 321 and the signal line conductor 323. In the first direction DIR1, the auxiliary conductor 326 is provided between the wiring conductor 322 and the signal line conductor 324. The plurality of ground auxiliary conductors 421 are provided inside the signal line portion ReTL. The plurality of ground auxiliary conductors 421 are spaced apart from one another in parallel or substantially in parallel to the first direction DIR1, and are provided between the signal line conductor 323 and the signal line conductor 324 in the second direction DIR2.

In the insulator layer 22, an interlayer connection conductor 521, an interlayer connection conductor 522, an interlayer connection conductor 523, an interlayer connection conductor 524, an interlayer connection conductor 525, an interlayer connection conductor 526, a plurality of interlayer connection conductors 527, an interlayer connection conductor 528, and an interlayer connection conductor 529 are provided. The interlayer connection conductor 521, the interlayer connection conductor 522, the interlayer connection conductor 523, the interlayer connection conductor 524, the interlayer connection conductor 525, the interlayer connection conductor 526, the plurality of interlayer connection conductors 527, the interlayer connection conductor 528, and the interlayer connection conductor 529 penetrate the insulator layer 22 between the main surface 221 and the main surface 222 (penetrate in the thickness direction).

The insulator layer 23 is a flat film including a main surface 231 and a main surface 232. The main surface 231 of the insulator layer 23 abuts on the main surface 222 of the insulator layer 22. On the main surface 231 of the insulator layer 23, a linear conductor 331, a linear conductor 332, a ground conductor 43, an auxiliary conductor 431, an auxiliary conductor 432, an auxiliary conductor 433, an auxiliary conductor 434 are provided.

The linear conductor 331 and the linear conductor 332 are provided closer to the first end portion E1 than to the second end portion E2. The linear conductor 331 and the linear conductor 332 have a shape extending along an angle that is neither orthogonal nor parallel to both the first direction DIR1 and the second direction DIR2. The linear conductor 331 and the linear conductor 332 are parallel or substantially parallel to each other. An angle between a direction in which the linear conductor 331 and the linear conductor 332 extend and a direction in which the linear conductor 311 and the linear conductor 312 extend is, for example, about 90°. This angle may be any angle as long as it is not about 180° (about 0°).

The ground conductor 43 is a rectangular or substantially rectangular conductor, and is provided on the entire or substantially the entire surface of the first signal line portion TL1 on the main surface 231 of the insulator layer 23.

The auxiliary conductor 431, the auxiliary conductor 432, the auxiliary conductor 433, and the auxiliary conductor 434 are rectangular or substantially rectangular conductors. The auxiliary conductor 431 and the auxiliary conductor 432 are provided near the first end portion E1. The auxiliary conductor 433 and the auxiliary conductor 434 are provided near the second end portion E2. The auxiliary conductor 433 is isolated from the ground conductor 43 with a conductor non-forming portion 403 interposed therebetween, and the auxiliary conductor 434 is isolated from the ground conductor 43 with a conductor non-forming portion 404 interposed therebetween.

In the insulator layer 23, an interlayer connection conductor 531, an interlayer connection conductor 532, an interlayer connection conductor 533, an interlayer connection conductor 534, and a plurality of interlayer connection conductors 535 are provided. The interlayer connection conductor 531, the interlayer connection conductor 532, the interlayer connection conductor 533, the interlayer connection conductor 534, and the plurality of interlayer connection conductors 535 penetrate the insulator layer 23 between the main surface 231 and the main surface 232 (penetrate in the thickness direction).

The insulator layer 24 is a flat film including a main surface 241 and a main surface 242. The main surface 241 of the insulator layer 24 abuts on the main surface 232 of the insulator layer 23. On the main surface 242 of the insulator layer 24, the external terminal conductor 611, the external terminal conductor 612, the external terminal conductor 613, the external terminal conductor 614, and the plurality of ground external terminal conductors 615 are provided.

The external terminal conductor 611, the external terminal conductor 612, the external terminal conductor 613, the external terminal conductor 614, and the plurality of ground external terminal conductors 615 are rectangular or substantially rectangular conductors.

The external terminal conductor 611 and the external terminal conductor 612 are provided near the first end portion E1. The external terminal conductor 613, the external terminal conductor 614, and the plurality of ground external terminal conductors 615 are provided near the second end portion E2.

In the insulator layer 24, the interlayer connection conductor 531, the interlayer connection conductor 532, the interlayer connection conductor 533, the interlayer connection conductor 534, and the plurality of interlayer connection conductors 535 are provided so as to follow the insulator layer 23. The interlayer connection conductor 531, the interlayer connection conductor 532, the interlayer connection conductor 533, the interlayer connection conductor 534, and the plurality of interlayer connection conductors 535 penetrate the insulator layer 24 between the main surface 241 and the main surface 242 (penetrate in the thickness direction).

Connection Patterns of Conductors

A first end of the wiring conductor 321 is connected to the external terminal conductor 611, which is the external connection terminal P11, with the interlayer connection conductor 521, the auxiliary conductor 431, and the interlayer connection conductor 531 interposed therebetween. A first end of the wiring conductor 322 is connected to the external terminal conductor 612, which is the external connection terminal P21, with the interlayer connection conductor 522, the auxiliary conductor 432, and the interlayer connection conductor 532 interposed therebetween. With this configuration, the signal line 112 and the signal line 122 illustrated in FIG. 4, that is, the second signal line portion TL2, is provided.

A second end of the wiring conductor 321 is connected to a first end of the linear conductor 311 with the interlayer connection conductor 511 interposed therebetween. A second end of the linear conductor 311 is connected to a first end of the linear conductor 331 with the interlayer connection conductor 512, the auxiliary conductor 326, and the interlayer connection conductor 525 interposed therebetween. A second end of the linear conductor 331 is connected to a first end of the signal line conductor 323 with the interlayer connection conductor 526 interposed therebetween. Accordingly, the coil 301 of the common-mode choke coil 300 connected to the external connection terminal P11 has a shape with a winding axis parallel or substantially parallel to the first direction DIR1.

A second end of the wiring conductor 322 is connected to a first end of the linear conductor 332 with the interlayer connection conductor 523 interposed therebetween. A second end of the linear conductor 332 is connected to a first end of the linear conductor 312 with the interlayer connection conductor 524, the auxiliary conductor 325, and the interlayer connection conductor 513 interposed therebetween. A second end of the linear conductor 312 is connected to a first end of the signal line conductor 324 with the interlayer connection conductor 514 interposed therebetween. Accordingly, the coil 302 of the common-mode choke coil 300 connected to the external connection terminal P21 has a shape with a winding axis parallel or substantially parallel to the first direction DIR1.

In this configuration, the linear conductors 311 and 331 defining the coil 301 and the linear conductors 312 and 332 defining the coil 302 are close to and parallel or substantially parallel to each other. At this time, the electromagnetic field coupling between the linear conductors 311 and 331 and the linear conductors 312 and 332 is stronger than the electromagnetic field coupling between the wiring conductor 321 and the wiring conductor 322 and the electromagnetic field coupling between the signal line conductor 323 and the signal line conductor 324. The strength of the electromagnetic field coupling is adjusted by, for example, the length of conductors that run side by side (distance of running side by side) and the distance (space) between conductors that run side by side. With this configuration, the common-mode choke coil 300 is provided in the coil portion CL.

A second end of the signal line conductor 323 is connected to the external terminal conductor 613, which is the external connection terminal P12, with the interlayer connection conductor 528, the auxiliary conductor 433, and the interlayer connection conductor 533 interposed therebetween. A second end of the signal line conductor 324 is connected to the external terminal conductor 614, which is the external connection terminal P22, with the interlayer connection conductor 529, the auxiliary conductor 434, and the interlayer connection conductor 534 interposed therebetween.

The ground conductor 41 and the ground conductor 43 are connected to each other with the plurality of interlayer connection conductors 515, the plurality of ground auxiliary conductors 421, and the plurality of interlayer connection conductors 527 interposed therebetween. In addition, the ground conductor 43 is connected to the plurality of ground external terminal conductors 615 with the plurality of interlayer connection conductors 535 interposed therebetween, respectively.

With this configuration, the signal line 111 and the signal line 121 illustrated in FIG. 4, that is, the first signal line portion TL1, with a strip-line structure is provided.

In this configuration, as described above, because of the fact that the bent portion BD is provided inside the first signal line portion TL1, application of bending stress to the common-mode choke coil 300 is reduced or prevented. In particular, by using a thermoplastic resin, for example, as the main material of the insulation substrate 20, the bent portion BD may be provided by plastic deformation, and application of bending stress to the common-mode choke coil 300 is further reduced or prevented.

In addition, in this configuration, the first signal line portion TL1 is provided with the flat-plate-shaped ground conductor 41 and ground conductor 43. Therefore, the shape of the bent portion BD is stably maintained by plastic deformation of the flat-plate-shaped ground conductor 41 and ground conductor 43. Note that at least one of the ground conductor 41 and the ground conductor 43 may be omitted. The curvature of the bent portion BD is greater than the curvature of the first signal line portion TL1 and the curvature of the second signal line portion TL2.

In addition, in this configuration, the common-mode choke coil 300 is provided at a position close to the first end portion E1, and the length of the second signal line portion TL2 parallel to the first direction DIR1 is short. Accordingly, transmission of noise in the second signal line portion TL2 may be reduced or prevented. At this time, for example, it is preferable that the length of the second signal line portion TL2, that is, the length of the wiring conductor 321 and the wiring conductor 322, is less than half the wavelength of an RF signal transmitted with the transmission line component 10. Accordingly, the occurrence of unnecessary resonance in the second signal line portion TL2 may be reduced or prevented.

In addition, in the above-described configuration, it is preferable that the width of the linear conductor 311, the linear conductor 312, the linear conductor 331, and the linear conductor 332 forming the coil portion CL is less than the width of the signal line conductor 323 and the signal line conductor 324 forming the first signal line portion TL1. Accordingly, Q of the coil 301 and the coil 302 is improved, and inductor characteristics are improved.

Second Preferred Embodiment

Figure 5:
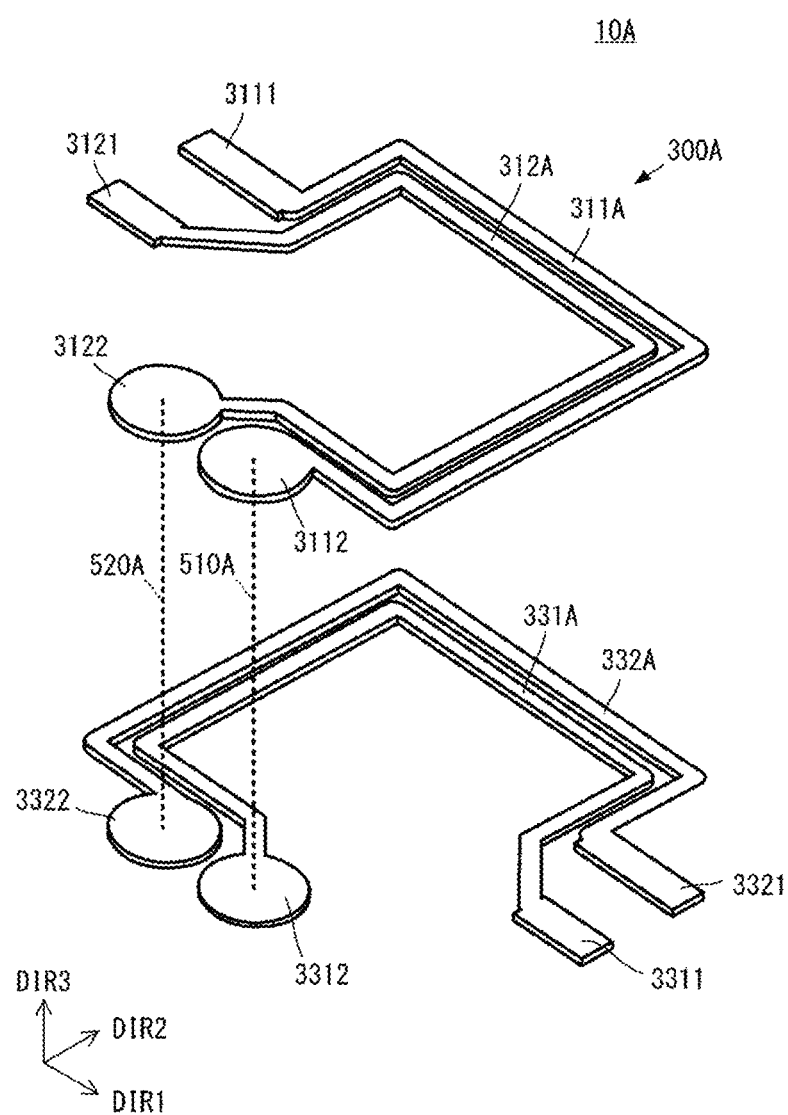
FIG. 5 is an exploded perspective view illustrating the shape of a common-mode choke coil of a transmission line component according to a second preferred embodiment of the present invention.

A transmission line component according to a second preferred embodiment of the present invention will be described with reference to the drawings. FIG. 5 is an exploded perspective view illustrating the shape of a common-mode choke coil of the transmission line component according to the second preferred embodiment.

A transmission line component 10A according to the second preferred embodiment includes a common-mode choke coil 300A. The configuration of the transmission line component 10A according to the second preferred embodiment, except for the common-mode choke coil 300A, is the same or substantially the same as the transmission line component 10 according to the first preferred embodiment, and descriptions of the same or corresponding portions are omitted.

The common-mode choke coil 300A includes a linear conductor 311A, a linear conductor 312A, a linear conductor 331A, and a linear conductor 332A. The linear conductor 311A, the linear conductor 312A, the linear conductor 331A, and the linear conductor 332A are ring-shaped not covering the entire or substantially the entire circumference (partially ring shaped). The linear conductor 311A and the linear conductor 312A are provided on the same layer of the insulation substrate 20, that is, at the same or substantially the same position in the thickness direction (third direction DIR3), and run side by side. The linear conductor 331A and the linear conductor 332A are provided on the same layer of the insulation substrate 20, that is, at the same or substantially the same position in the thickness direction (third direction DIR3), and run side by side.

The layer where the linear conductor 311A and the linear conductor 312A are provided and the layer where the linear conductor 331A and the linear conductor 332A are provided are different. In other words, in the thickness direction (third direction DIR3) of the insulation substrate 20, the position at which the linear conductor 311A and the linear conductor 312A are arranged and the position at which the linear conductor 331A and the linear conductor 332A are provided are different.

The linear conductor 311A and the linear conductor 332A overlap each other, and the linear conductor 312A and the linear conductor 331A overlap each other.

A wiring conductor 3111 is connected to a first end of the linear conductor 311A, and an auxiliary pad conductor 3112 is connected to a second end of the linear conductor 311A. A wiring conductor 3121 is connected to a first end of the linear conductor 312A, and an auxiliary pad conductor 3122 is connected to a second end of the linear conductor 312A.

A wiring conductor 3311 is connected to a first end of the linear conductor 331A, and an auxiliary pad conductor 3312 is connected to a second end of the linear conductor 331A. A wiring conductor 3321 is connected to a first end of the linear conductor 332A, and an auxiliary pad conductor 3322 is connected to a second end of the linear conductor 332A.

The auxiliary pad conductor 3112 and the auxiliary pad conductor 3312 are connected to each other with an interlayer connection conductor 510A interposed therebetween. The auxiliary pad conductor 3122 and the auxiliary pad conductor 3322 are connected to each other with an interlayer connection conductor 520A interposed therebetween.

With the above-described configuration, a first coil (corresponding to the coil 301) that includes the linear conductor 311A and the linear conductor 331A as a main portion, that includes an aperture with a certain area in the center or approximate center, and that has a spiral shape with a winding axis parallel or substantially parallel to the third direction DIR3 is provided. In addition, a second coil (corresponding to the coil 302) that includes the linear conductor 312A and the linear conductor 332A as a main portion, that includes an aperture with a certain area in the center, and that has a spiral shape with a winding axis parallel or substantially parallel to the third direction DIR3 is formed. Because of the fact that the first coil and the second coil are close to each other, the common-mode choke coil 300A is provided.

In this manner, the transmission line component 10A has a configuration including the common-mode choke coil 300A with a winding axis that is different from the transmission line component according to the first preferred embodiment, and that is parallel or substantially parallel to the thickness direction of the insulation substrate 20. Even with the above-described configuration, the transmission line component 10A may have advantageous effects that are the same as or similar to the transmission line component 10.

In addition, in this configuration, the linear conductors of the first coil and the linear conductors of the second coil are close to each other in all the first direction DIR1, the second direction DIR2, and the third direction DIR3, and are easily coupled to each other. Therefore, the common-mode choke coil 300A may more reliably provide desired characteristics.

In addition, in this configuration, the area of the aperture in the center or approximate center may be increased without thickening the insulation substrate 20. Accordingly, the transmission line component 10A, which is thin, may improve the characteristics of the first coil and the second coil forming the common-mode choke coil 300A.

Third Preferred Embodiment

Figure 6:
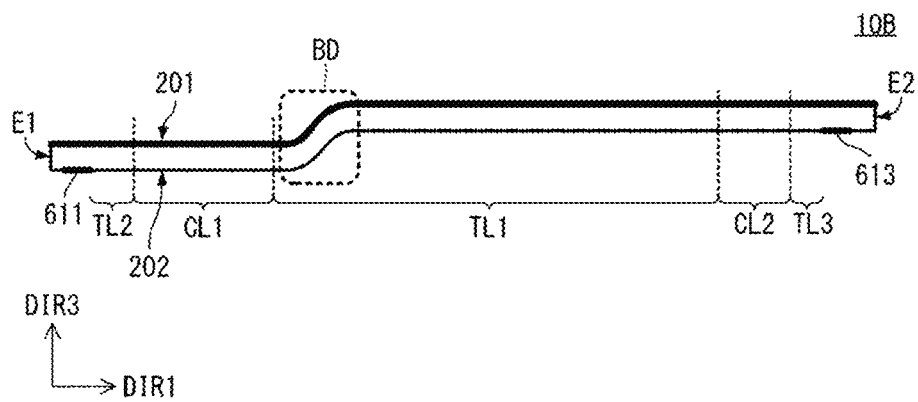
FIG. 6 is a lateral view illustrating a schematic configuration of a transmission line component according to a third preferred embodiment of the present invention.

A transmission line component according to a third preferred embodiment of the present invention will be described with reference to the drawings. FIG. 6 is a lateral view illustrating a schematic configuration of the transmission line component according to the third preferred embodiment.

As illustrated in FIG. 6, a transmission line component 10B according to the third preferred embodiment is different from the transmission line component 10 according to the first preferred embodiment in that the transmission line component 10B includes a coil portion CL1 and a coil portion CL2.

The transmission line component 10B includes the coil portion CL1 near the first end portion E1, and includes the coil portion CL2 near the second end portion E2. A first end of the coil portion CL1 is connected to the second signal line portion TL2, and a second end of the coil portion CL1 is connected to the first signal line portion TL1. The first signal line portion TL1 is connected to a first end of the coil portion CL2, and a second end of the coil portion CL2 is connected to a third signal line portion TL3. The third signal line portion TL3 has, for example, a configuration that is the same as or similar to the second signal line portion TL2 described in the above preferred embodiments. A specific internal structure of the coil portion CL1 and the coil portion CL2 is the same as or similar to the structure of the transmission line components 10 and 10A according to the above-described first and second preferred embodiments.

Even with the above-described configuration, the transmission line component 10B may have advantageous effects that are the same as or similar to the above-described preferred embodiments. In addition, because the coil portion CL1 and the coil portion CL2 are each provided near an external connection terminal in the transmission line component 10B, the length of the second signal line portion TL2 and the third signal line portion TL3 is shortened, and transmission of noise in the second signal line portion TL2 and the third signal line portion TL3 may be reduced or prevented.

Fourth Preferred Embodiment

Figure 7A:
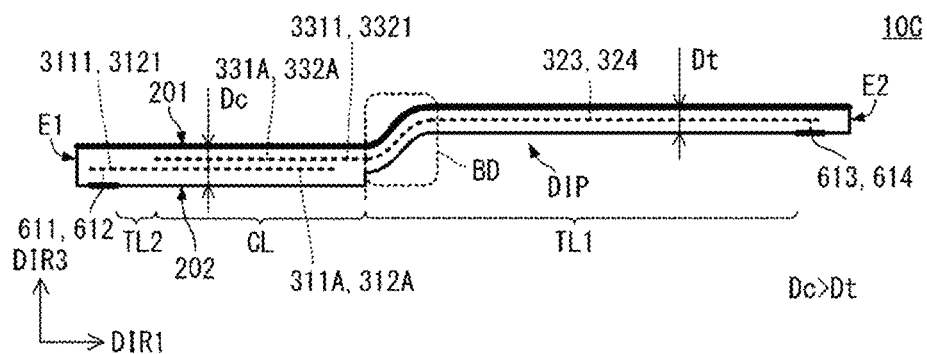
FIG. 7A is a lateral view illustrating a schematic configuration of a transmission line component according to a fourth preferred embodiment.
Figure 7B:
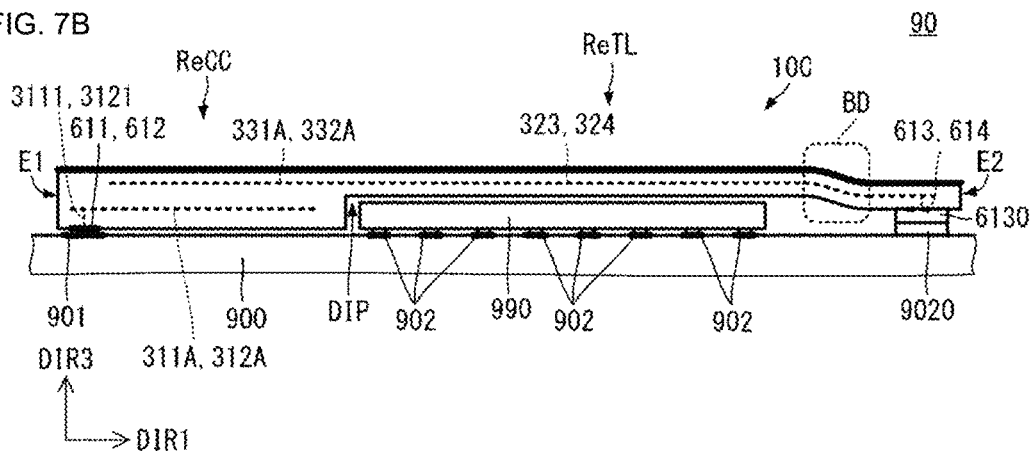
FIG. 7B is a lateral view illustrating a schematic configuration of an electronic device module according to the fourth preferred embodiment of the present invention.

A transmission line component according to a fourth preferred embodiment of the present invention will be described with reference to the drawings. FIG. 7A is a lateral view illustrating a schematic configuration of the transmission line component according to the fourth preferred embodiment, and FIG. 7B is a lateral view illustrating a schematic configuration of an electronic device module according to the fourth preferred embodiment.

As illustrated in FIG. 7A, a transmission line component 10C according to the fourth preferred embodiment is different from the transmission line component 10 according to the first preferred embodiment in the relationship between the thickness of the coil portion CL and the thickness of the first signal line portion TL1. The rest of the configuration of the transmission line component 10C is the same or substantially the same as the transmission line component 10, and descriptions of the same portions are omitted.

The coil portion CL includes, for example, the common-mode choke coil 300A described in the second preferred embodiment. However, in the present preferred embodiment, in the configuration of the common-mode choke coil 300A, the vertical positional relationship between the wiring conductor 3111 and the wiring conductor 3121, and the wiring conductor 3311 and the wiring conductor 3321 is reversed.

The wiring conductor 3111 and the wiring conductor 3121 are provided near the first end portion E1. The second signal line portion TL2 is defined by the wiring conductor 3111 and the wiring conductor 3121. The wiring conductor 3311 and the wiring conductor 3321 are provided near an end portion of a connection with the first signal line portion TL1.

The wiring conductor 3111 and the wiring conductor 3121 are provided on the same layer. The wiring conductor 3311 and the wiring conductor 3321 are provided on the same layer. In the thickness direction (third direction DIR3) of the insulation substrate 20, the position of the wiring conductor 3111 and the wiring conductor 3121 is different from the position of the wiring conductor 3311 and the wiring conductor 3321. More specifically, the wiring conductor 3111 and the wiring conductor 3121 are closer to the second main surface 202 than the wiring conductor 3311 and the wiring conductor 3321. In other words, the wiring conductor 3311 and the wiring conductor 3321 are closer to the first main surface 201 than the wiring conductor 3111 and the wiring conductor 3121.

The wiring conductor 3311 is connected to the signal line conductor 323, which is provided at the same or substantially the same position in the thickness direction (third direction DIR3), without an interlayer connection conductor interposed therebetween. The wiring conductor 3321 is connected to the signal line conductor 324, which is provided at the same or substantially the same position in the thickness direction (third direction DIR3), without an interlayer connection conductor interposed therebetween.

A thickness Dc of the coil portion CL is greater than a thickness Dt of the first signal line portion TL1. Accordingly, the shape of the coil portion CL becomes more stable (less likely to deform) than the shape of the first signal line portion TL1. In contrast, the first signal line portion TL1 bends more easily than the coil portion CL. Therefore, the transmission line component 10C is such that, because the bent portion BD is easily provided in the first signal line portion TL1, defects such as breakage of the coil portion CL caused by forming the bent portion BD may be further reduced or prevented.

In addition, as illustrated in FIGS. 7A and 7B, in the transmission line component 10C, the first main surface 201 in the first signal line portion TL1 and the first main surface 201 in the coil portion CL are continuous without a step. In contrast, the second main surface 202 in the first signal line portion TL1 is continuous with the second main surface 202 in the coil portion CL with a step recessed toward the first main surface 201 side interposed therebetween. That is, the transmission line component 10C has a shape including a recess DIP in a portion of the insulation substrate 20 where the first signal line portion TL1 is provided.

In the above-described configuration, the configuration of an electronic device module 90 as illustrated in FIG. 7B may be provided. The electronic device module 90 includes the transmission line component 10C, a circuit substrate 900, and a mountable electronic component 990. On the circuit substrate 900, a mountable land 901, mountable lands 902, and a connector 9020 are provided. In the first direction DIR1, the mountable lands 902 are arranged between the mountable land 901 and the connector 9020.

The mountable electronic component 990 is connected to the mountable lands 902. The external terminal conductors 611 and 612 of the transmission line component 10C are connected to the mountable land 901, and a connector 6130 connected to the external terminal conductors 613 and 614 of the transmission line component 10C is connected to the connector 9020.

At this time, because the transmission line component 10C includes the recess DIP, the transmission line component 10C may be connected to the circuit substrate 900 so that the mountable electronic component 990 overlaps the recess DIP.

Accordingly, the transmission line component 10C may be connected to the circuit substrate 900 at the external terminal conductor 611 of the first end portion E1, which has the same or substantially the same thickness as the thick coil portion CL, while including an overlap between the thin first signal line portion TL1 and the mountable electronic component 990. Therefore, the electronic device module 90 may be thin without needing to provide the transmission line component 10C so as to avoid the mountable electronic component 990. In addition, in this configuration, the bent portion BD is provided near an end portion on the opposite side of the coil portion CL in the first signal line portion TL1. Therefore, defects such as breakage of the coil portion CL caused by providing the bent portion BD may be further reduced or prevented.

In addition, in this configuration, the wiring conductor 3111 and the wiring conductor 3121 (a portion corresponding to the second signal line portion TL2) which connect the common-mode choke coil 300A to the external terminal conductor 611 and the external terminal conductor 612 are provided near the second main surface 202. Therefore, interlayer connection conductors that connect the external terminal conductor 611 and the external terminal conductor 612 to the wiring conductor 3111 and the wiring conductor 3121 may be shortened. Therefore, the electrical distance between the common-mode choke coil 300A and the circuit substrate 900 may be shortened, thus reducing or preventing transmission of noise between the common-mode choke coil 300A and the circuit substrate 900.

In addition, in the configuration in FIG. 7B, the wiring conductor 3311 and the wiring conductor 3321 connected to the common-mode choke coil 300A are connected to the signal line conductor 323 and the signal line conductor 324 without interlayer connection conductors interposed therebetween. Accordingly, the linear conductor 331A and the linear conductor 332A of the common mode choke coil 300A may be connected to the signal line conductor 323 and the signal line conductor 324 of the common-mode choke coil 300A without interlayer connection conductors therebetween, thus improving the connection reliability. With this configuration, for example, as illustrated in FIG. 7A, even when the bent portion BD is provided near the boundary between the coil portion CL and the first signal line portion TL1, the reliability of connection of the common-mode choke coil 300A with the signal line conductor 323 and the signal line conductor 324 defining differential lines is improved, and the occurrence of various defects as described above caused by providing the bent portion BD is reduced or prevented.

In addition, in this configuration, the second end portion E2 on the first signal line portion TL1 side, which is easy to bend, is connected to the circuit substrate 900 with a connector interposed therebetween, and the first end portion E1 on the coil portion CL side, which is difficult to bend, is connected directly to the circuit substrate 900 by, for example, soldering or the like. Accordingly, the transmission line component 10C may be more stably and easily connected to the circuit substrate 900, and external stress at the time of connection may be made smaller, thus reducing or preventing the occurrence of various defects mentioned above due to external stress generated at the time of connection.

Fifth Preferred Embodiment

Figure 8:
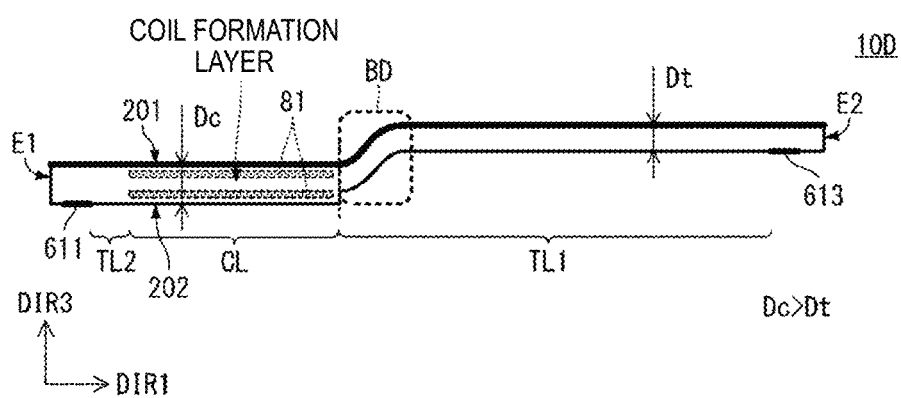
FIG. 8 is a lateral view illustrating a schematic configuration of a transmission line component according to a fifth preferred embodiment of the present invention.

A transmission line component according to a fifth preferred embodiment of the present invention will be described with reference to the drawings. FIG. 8 is a lateral view illustrating a schematic configuration of the transmission line component according to the fifth preferred embodiment.

As illustrated in FIG. 8, a transmission line component 10D according to the fifth preferred embodiment is different from the transmission line component 10C according to the fourth preferred embodiment in the structure inside the coil portion CL. The rest of the configuration of the transmission line component 10D is the same or substantially the same as the transmission line component 10C, and descriptions of the same or corresponding portions are omitted.

Magnetic bodies 81 are provided inside the coil portion CL of the transmission line component 10D. The magnetic bodies 81 are provided so as to, in the third direction DIR3, hold therebetween a coil formation layer where a common-mode choke coil is provided. The magnetic bodies 81 hold therebetween the common-mode choke coil in the coil portion CL. The magnetic bodies 81 are made of, for example, a Mn—Zn-based ferrite, a Ni—Zn-based ferrite, or the like.

With the above-described configuration, the characteristics of the common-mode choke coil are improved. Furthermore, although the magnetic bodies 81 easily break, because the magnetic bodies 81 are provided inside the thick coil portion CL, the magnetic bodies 81 become less likely to break. Therefore, changes in the characteristics of the common-mode choke coil caused by breakage may be reduced or prevented.

Note that the structure may be such that the magnetic bodies 81 hold therebetween the coil portion not only in the thickness direction (third direction DIR3), but also in the first direction DIR1 and/or the second direction DIR2 (illustrations omitted).

Sixth Preferred Embodiment

Figure 9:
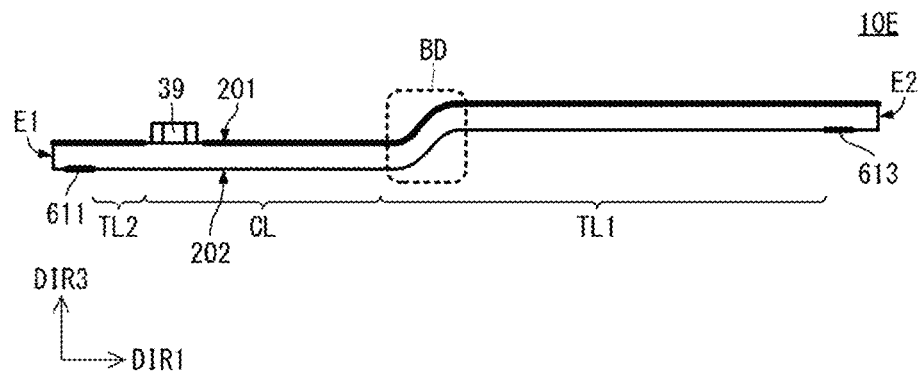
FIG. 9 is a lateral view illustrating a schematic configuration of a transmission line component according to a sixth preferred embodiment of the present invention.

A transmission line component according to a sixth preferred embodiment of the present invention will be described with reference to the drawings. FIG. 9 is a lateral view illustrating a schematic configuration of the transmission line component according to the sixth preferred embodiment.

As illustrated in FIG. 9, a transmission line component 10E according to the sixth preferred embodiment is different from the transmission line component 10 according to the first preferred embodiment in that a common-mode choke coil element 39 is included. The rest of the configuration of the transmission line component 10E is the same or substantially the same as the transmission line component 10, and descriptions of the same or corresponding portions are omitted.

The transmission line component 10E includes the common-mode choke coil element 39. The common-mode choke coil element 39 is a surface-mountable component, and is mounted on the first main surface 201 of the insulation substrate 20. The common-mode choke coil element 39 is mounted in the coil portion CL. At this time, it is preferable that the position at which the common-mode choke coil element 39 is mounted is as far from the bent portion BD as possible.

The common-mode choke coil 300 (illustration is omitted in FIG. 9) and the common-mode choke coil element 39 are connected to, for example, signal lines to transmit differential signals using the following circuit configuration.

Figure 10A:
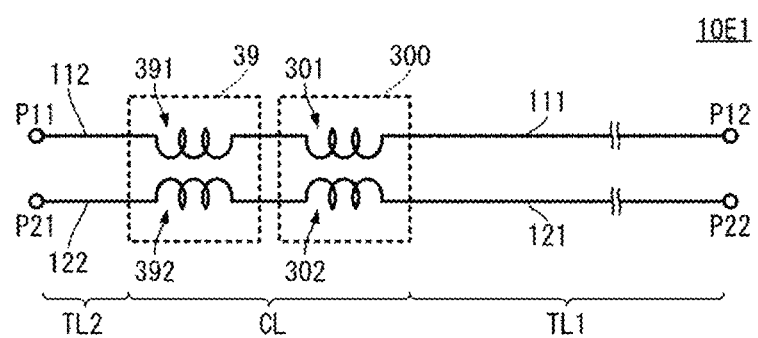
FIGS. 10A and 10B are each an equivalent circuit diagram illustrating an example of a circuit pattern of the transmission line component according to the sixth preferred embodiment of the present invention.
Figure 10B:
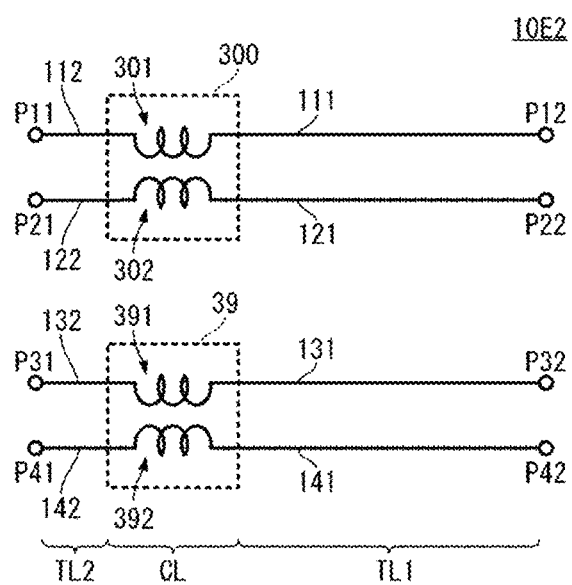

FIGS. 10A and 10B are each an equivalent circuit diagram illustrating an example of a circuit pattern of the transmission line component according to the sixth preferred embodiment.

In a transmission line component 10E1 illustrated in FIG. 10A, the common-mode choke coil 300 and the mountable common-mode choke coil element 39 are connected in series to a pair of signal lines for differential signals.

A coil 391 of the mountable common-mode choke coil element 39 is connected to the external connection terminal P11 with the signal line 112 interposed therebetween, and the coil 301 of the common-mode choke coil 300 is connected to the coil 391. The signal line 111 is connected to the coil 301, and the external connection terminal P12 is connected to the signal line 111. In addition, a coil 392 of the mountable common-mode choke coil element 39 is connected to the external connection terminal P21 with the signal line 122 interposed therebetween, and the coil 302 of the common-mode choke coil 300 is connected to the coil 392.

The signal line 121 is connected to the coil 302, and the external connection terminal P22 is connected to the signal line 121.

In a transmission line component 10E2 illustrated in FIG. 10B, the common-mode choke coil 300 and the common-mode choke coil element 39 are respectively connected to different pairs of signal lines to transmit differential signals.

The coil 301 of the common-mode choke coil 300 is connected to the external connection terminal P11 with the signal line 112 interposed therebetween. The signal line 111 is connected to the coil 301, and the external connection terminal P12 is connected to the signal line 111. The coil 302 of the common-mode choke coil 300 is connected to the external connection terminal P21 with the signal line 122 interposed therebetween. The signal line 121 is connected to the coil 302, and the external connection terminal P22 is connected to the signal line 121.

In addition, the coil 391 of the common-mode choke coil element 39 is connected to an external connection terminal P31 with a signal line 132 interposed therebetween. A signal line 131 is connected to the coil 391, and an external connection terminal P32 is connected to the signal line 131. In addition, the coil 392 of the common-mode choke coil element 39 is connected to an external connection terminal P41 with a signal line 142 interposed therebetween. A signal line 141 is connected to the coil 392, and an external connection terminal P42 is connected to the signal line 141.

Figure 11A:
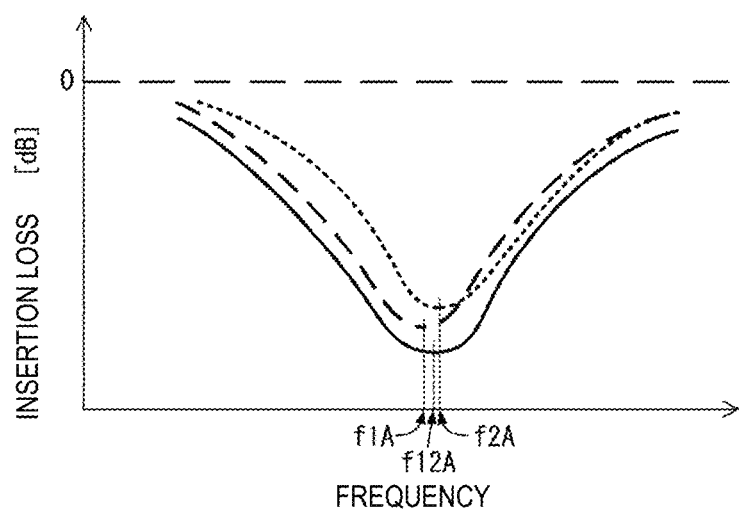
FIGS. 11A and 11B are graphs illustrating setting examples of characteristics.
Figure 11B:
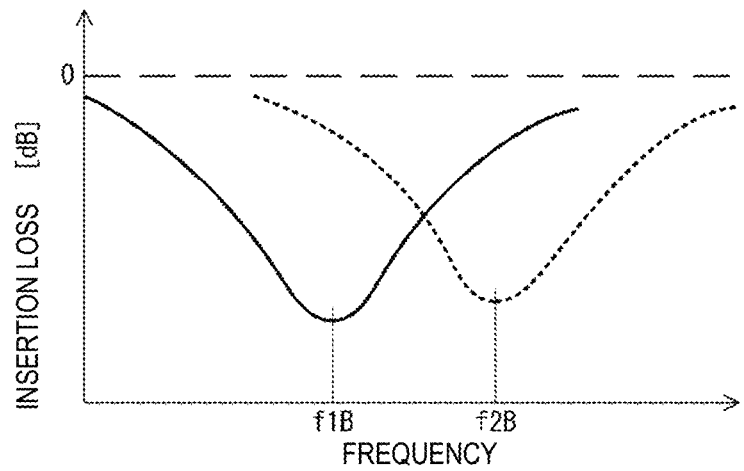

Here, the common-mode choke coil 300 is defined by linear conductors provided on or in the insulation substrate 20. Therefore, the common-mode choke coil 300 and the common-mode choke coil element 39 may have different coil shapes, whether there is a magnetic body, the type of magnetic body, the type of insulator, and the like. Accordingly, the common-mode choke coil 300 and the common-mode choke coil element 39 may easily provide different characteristics. FIGS. 11A and 11B are graphs illustrating setting examples of characteristics.

For example, as illustrated in FIG. 11A, a resonant frequency f1A of the common-mode choke coil 300 and a resonant frequency f2A of the common-mode choke coil element 39 are close to or match each other. Their frequency characteristics are adjusted, and this configuration is applied to, for example, the circuit configuration illustrated in FIG. 10A. Accordingly, the transmission line component 10E1 may have a configuration with which, as illustrated in FIG. 11A, an attenuation at a pole frequency f12A may be made greater than an attenuation at the resonant frequency f1A and the resonant frequency f2A, and a desired attenuation may be obtained over a wide band. The frequency characteristics refer to, for example, the relationship between frequency and the insertion loss of the transmission line component.

In addition, as illustrated in FIG. 11B, a resonant frequency f1B of the common-mode choke coil 300 and a resonant frequency f2B of the common-mode choke coil element 39 are different from one another. This configuration is applied to, for example, the circuit configuration illustrated in FIG. 10B. Accordingly, the transmission line component 10E2 may reduce or prevent common-mode noise in differential signals with different frequencies, and respectively transmit differential signals.

In addition, as described above, by adjusting the resonant frequencies f1A and f1B of the common-mode choke coil 300, the resonant frequencies f2A and f2B of the common-mode choke coil element 39, and their frequency characteristics, the transmission line components 10E, 10E1, and 10E2 may reduce or prevent common-mode noise more reliably and stably in accordance with the combination of frequencies of differential signals transmitted, the number thereof, etc.

Seventh Preferred Embodiment

Figure 12A:
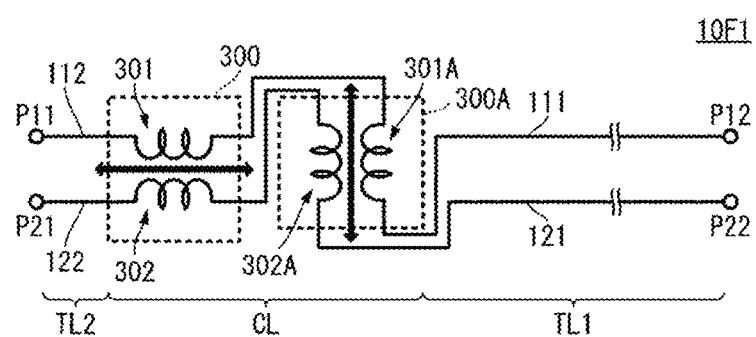
FIGS. 12A and 12B are each an equivalent circuit diagram illustrating an example of a circuit pattern of a transmission line component according to a seventh preferred embodiment of the present invention.
Figure 12B:
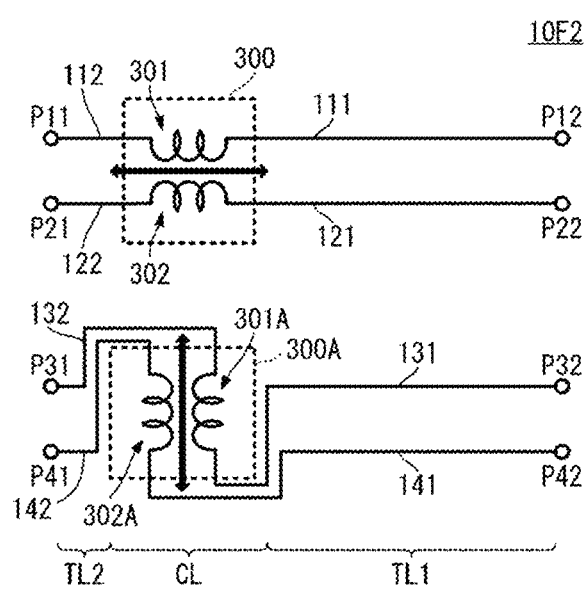

A transmission line component according to a seventh preferred embodiment of the present invention will be described with reference to the drawings. FIGS. 12A and 12B are each an equivalent circuit diagram illustrating an example of a circuit pattern of the transmission line component according to the seventh preferred embodiment.

As illustrated in FIGS. 12A and 12B, transmission line components 10F1 and 10F2 according to the seventh preferred embodiment are different from the transmission line component 10 according to the first preferred embodiment in that the transmission line components 10F1 and 10F2 include two common mode choke coils, that is, the common-mode choke coil 300 and the common-mode choke coil 300A.

The rest of the configuration of the transmission line components 10F1 and 10F2 is the same or substantially the same as the transmission line component 10, and descriptions of the same or corresponding portions are omitted.

The common-mode choke coil 300 illustrated in FIGS. 12A and 12B has a winding axis parallel or substantially parallel to the first direction DIR1, as described in the first preferred embodiment. The common-mode choke coil 300A has a winding axis parallel or substantially parallel to the third direction DIR3, as described in the second preferred embodiment. That is, the common-mode choke coil 300 and the common-mode choke coil 300A are provided on or in the insulation substrate 20 so that their winding axes are orthogonal or substantially orthogonal to each other.

In the case of FIG. 12A, the transmission line component 10F1 is the same as or similar to the transmission line component 10E1 illustrated in FIG. 10A, and the common-mode choke coil 300 and the common-mode choke coil 300A are connected in series to a pair of signal lines for differential signals.

In the case of FIG. 12B, the transmission line component 10F2 is the same as or similar to the transmission line component 10E2 illustrated in FIG. 10B, and the common-mode choke coil 300 and the common-mode choke coil 300A are respectively connected to different pairs of signal lines for differential signals.

As illustrated in FIGS. 12A and 12B, because the winding axis of the common-mode choke coil 300 and the winding axis of the common-mode choke coil 300A are orthogonal or substantially orthogonal to each other, the coupling and interference between the common-mode choke coil 300 and the common-mode choke coil 300A may be reduced or prevented. In particular, in the transmission line component of the present invention, the area of the coil portion CL is small, and the common-mode choke coil 300 and the common-mode choke coil 300A are likely to be close to each other. Even in such a case, with the configuration of the present preferred embodiment, the coupling and interference between the common-mode choke coil 300 and the common-mode choke coil 300A may be effectively reduced or prevented.

Although the winding axis of the common-mode choke coil 300 and the winding axis of the common-mode choke coil 300A may be anything as long as they are not parallel or substantially parallel to each other, it is preferable that the two winding axes are as close to orthogonal as possible (the angle of about 90°).

Eighth Preferred Embodiment

Figure 13:
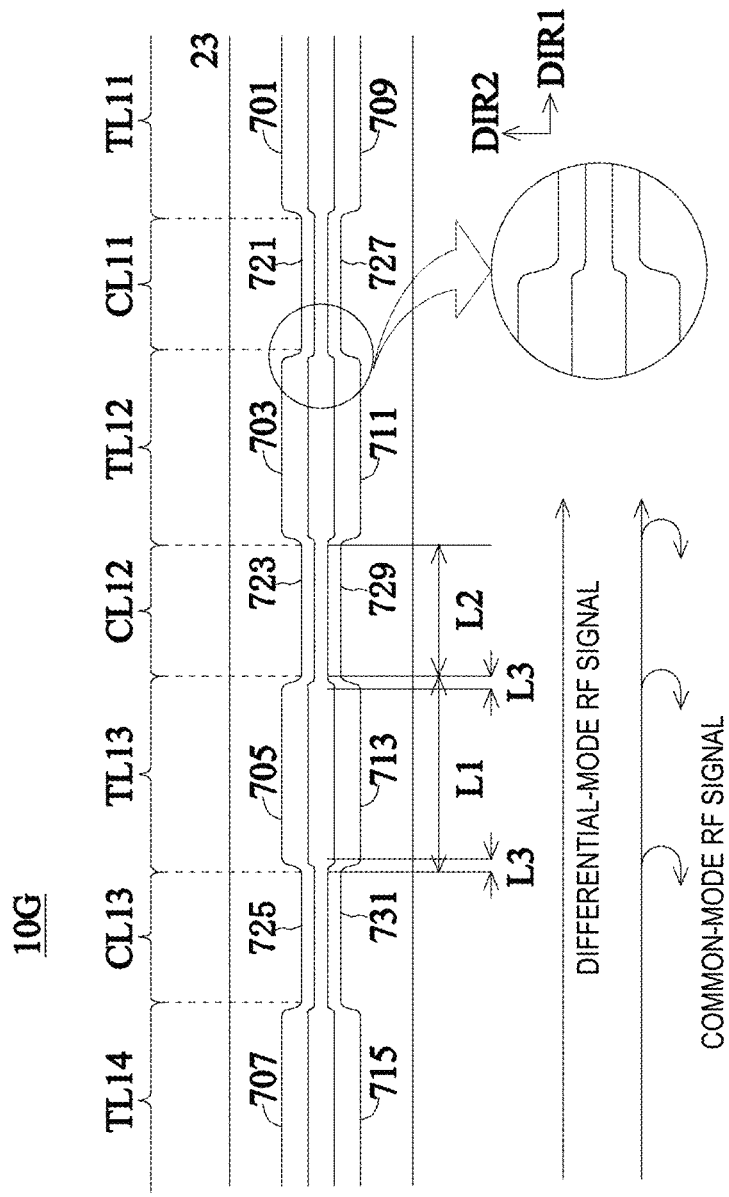
FIG. 13 is a top view of signal conductors of a transmission line component according to an eighth preferred embodiment of the present invention.

A transmission line component according to an eighth preferred embodiment of the present invention will be described with reference to the drawings. FIG. 13 is a top view of signal conductors of the transmission line component according to the eighth preferred embodiment.

The insulation substrate 20 of a transmission line component 10G includes a plurality of coil portions CL11 to CL13 and a plurality of signal line portions TL11 to TL14. The plurality of coil portions CL11 to CL13 and the plurality of signal line portions TL11 to TL14 are alternately provided in the first direction DIR1.

On the insulator layer 23 of the insulation substrate 20, signal conductors 701, 703, 705, 707, 709, 711, 713, 715, 721, 723, 725, 727, 729, and 731 are provided. The signal conductors 701, 721, 703, 723, 705, 725, and 707 are connected in series so as to be provided in this order. The signal conductors 709, 727, 711, 729, 713, 731, and 715 are connected in series so as to be provided in this order.

The width of the signal conductors 721, 723, 725, 727, 729, and 731 in the plurality of coil portions CL11 to CL13 is smaller than the width of the signal conductors 701, 703, 705, 707, 709, 711, 713, and 715 in the plurality of signal line portions TL11 to TL14. Furthermore, the distance between the signal conductors 721, 723, 725, 727, 729, and 731 in the plurality of coil portions CL11 to CL13 is smaller than the distance between the signal conductors 701, 703, 705, 707, 709, 711, 713, and 715 in the plurality of signal line portions TL11 to TL14. Accordingly, the coupling of the signal conductors 721, 723, 725, 727, 729, and 731 in the plurality of coil portions CL11 to CL13 is stronger than the coupling of the signal conductors 701, 703, 705, 707, 709, 711, 713, and 715 in the plurality of signal line portions TL11 to TL14. Therefore, the plurality of coil portions CL11 to CL13 define and function as a common-mode choke coil. That is, the plurality of coil portions CL11 to CL13 attenuate a common-mode RF signal.

In addition, the characteristic impedance of the plurality of signal line portions TL11 to TL14 for a differential-mode RF signal matches the characteristic impedance of the plurality of coil portions CL11 to CL13 for a differential-mode RF signal. The characteristic impedance of the plurality of signal line portions TL11 to TL14 for a differential-mode RF signal, and the characteristic impedance of the plurality of coil portions CL11 to CL13 for a differential-mode RF signal are, for example, about 100Ω. In contrast, the characteristic impedance of the plurality of signal line portions TL11 to TL14 for a common-mode RF signal does not match the characteristic impedance of the plurality of coil portions CL11 to CL13 for a common-mode RF signal. The characteristic impedance of the plurality of signal line portions TL11 to TL14 for a common-mode RF signal is, for example, about 33 ohms. The characteristic impedance of the plurality of coil portions CL11 to CL13 for a common-mode RF signal is, for example, about 93 ohms. As described above, the difference between the characteristic impedance (for example, about 100Ω) of the plurality of signal line portions TL11 to TL14 for a differential-mode RF signal and the characteristic impedance (for example, about 100Ω) of the plurality of coil portions CL11 to CL13 for a differential-mode RF signal is smaller than the difference between the characteristic impedance (for example, about 33Ω) of the plurality of signal line portions TL11 to TL14 for a common-mode RF signal and the characteristic impedance (for example, about 93Ω) of the plurality of coil portions CL11 to CL14 for a common-mode RF signal.

Accordingly, a differential-mode RF signal is hardly reflected at the boundaries between the plurality of signal line portions TL11 to TL14 and the plurality of coil portions CL11 to CL13. In contrast, a common-mode RF signal is reflected at the boundaries between the plurality of signal line portions TL11 to TL14 and the plurality of coil portions CL11 to CL13. As a result, a differential-mode RF signal is transmitted, and a common-mode RF signal is attenuated in the transmission line component 10G.

In addition, a length L1 of the plurality of signal line portions TL11 to TL14 in the first direction DIR1 is longer than a length L2 of the coil portions CL11 to CL13. As described above, the width of the signal conductors 701, 703, 705, 707, 709, 711, 713, and 715 in the plurality of signal line portions TL11 to TL14 is greater than the width of the signal conductors 721, 723, 725, 727, 729, and 731 in the plurality of coil portions CL11 to CL13. Therefore, the resistance per unit length of the signal conductors 701, 703, 705, 707, 709, 711, 713, and 715 in the plurality of signal line portions TL11 to TL14 is smaller than the resistance per unit length of the signal conductors 721, 723, 725, 727, 729, and 731 in the plurality of coil portions CL11 to CL13. To this end, the length L1 of the plurality of signal line portions TL11 to TL14 in the first direction DIR1 is longer than the length L2 of the coil portions CL11 to CL13 in the first direction DIR1. Accordingly, sections where the resistance per unit length is small are longer in the transmission line component 10G. As a result, the insertion loss of the transmission line component 10G is reduced.

In addition, two end portions of the plurality of signal line portions TL11 to TL14 are tapered. A length L3 of each of the two end portions of the plurality of signal line portions TL11 to TL14 in the first direction DIR1 is, for example, less than or equal to about ¼ of the length of the plurality of coil portions CL11 to CL13 in the first direction DIR1. That is, the length of the plurality of coil portions CL11 to CL13 in the first direction DIR1 is designed to be sufficiently short. Accordingly, the fluctuation of the characteristic impedance at the boundaries between the signal line portions TL11 to TL14 and the coil portions CL11 to CL13 for a common-mode RF signal becomes rapid. Therefore, a differential-mode RF signal is transmitted, and a common-mode RF signal is attenuated in the transmission line component 10G.

The signal conductors 721, 723, 725, 727, 729, and 731 in the plurality of coil portions CL11 to CL13 are designed to be of a length that is about half the wavelength of an RF signal. The length of the tapered sections is designed to be, for example, about 1/10 of an RF signal.

In addition, it is preferable that the width of the tapered sections in the plurality of signal line portions TL11 to TL14 change continuously, as illustrated in an enlarged diagram in FIG. 13. That is, it is preferable that no corners are provided at two end portions of the plurality of signal line portions TL11 to TL14. In this manner, because of the fact that no corners are provided at two end portions of the plurality of signal line portions TL11 to TL14, a transmission loss of an RF signal due to the concentration of an electric field at the corners is reduced or prevented.

The mode in which the transmission line component is connected to the outside using external terminal conductors has been described as an example in the each of the above-described preferred embodiments. However, the mode using connectors is also possible. The mode in which external terminal conductors are directly connected and the mode in which connection is established using connectors may be used together.

The frequency characteristics of the common-mode choke coil 300 and the frequency characteristics of the common-mode choke coil 300A may be different.

In addition, the configurations of the above-described preferred embodiments may be combined appropriately, and advantageous effects according to the combination may be achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line component comprising:
a substrate with a shape extending in a first direction, and including an insulating material;
a first signal conductor and a second signal conductor on or in the substrate; and
a common-mode choke coil including a coupling between the first signal conductor and the second signal conductor; wherein
the substrate includes:
a coil portion in which the common-mode choke coil is provided; and
a signal line portion in which the coupling between the first signal conductor and the second signal conductor is weaker than the common-mode choke coil.

2. The transmission line component according to claim 1, wherein the signal line portion includes a bent portion bent in a thickness direction of the substrate.

3. The transmission line component according to claim 1, wherein a width of the signal conductors in the coil portion is smaller than a width of the signal conductors in the signal line portion.

4. The transmission line component according to claim 1, wherein a length of the signal line portion in the first direction is greater than a length of the coil portion in the first direction.

5. The transmission line component according to claim 1, wherein the signal line portion includes a ground conductor facing the first signal conductor and the second signal conductor in a thickness direction of the substrate.

6. The transmission line component according to claim 1, wherein the substrate includes a thermoplastic resin.

7. The transmission line component according to claim 1, wherein the substrate includes a first external connection conductor and a second external connection conductor spaced apart from each other in the first direction;
the signal line portion includes, in the first direction, a first signal line portion connected to a first end of the common-mode choke coil and the first external connection conductor, and a second signal line portion connected to a second end of the common-mode choke coil and the second external connection conductor;
the first signal line portion includes a bent portion bent in a thickness direction of the substrate; and
a plurality of signal conductors in the second signal line portion are shorter than about half a wavelength of a frequency of a radio frequency signal being transmitted.

8. The transmission line component according to claim 1, wherein
the coil portion includes a first coil portion in which a first common-mode choke coil is provided, and a second coil portion in which a second common-mode choke coil is provided; and
the first common-mode choke coil and the second common-mode choke coil are connected to the first signal conductor and the second signal conductor.

9. The transmission line component according to claim 8, wherein frequency characteristics of the first common-mode choke coil and frequency characteristics of the second common-mode choke coil are different from one another.

10. The transmission line component according to claim 1, wherein a thickness of the coil portion is greater than a thickness of the signal line portion.

11. The transmission line component according to claim 1, wherein the common-mode choke coil is a spiral-shaped coil with a winding axis parallel or substantially parallel to the thickness direction.

12. The transmission line component according to claim 1, wherein
a thickness of the coil portion is greater than a thickness of the signal line portion;
the common-mode choke coil is a spiral-shaped coil with a winding axis parallel or substantially parallel to the thickness direction; and
in the thickness direction of the substrate, a first end of the common-mode choke coil is at a same or substantially a same position as the signal line portion, and a second end is at a position different from the signal line portion.

13. The transmission line component according to claim 1, wherein the coil portion includes magnetic bodies.

14. The transmission line component according to claim 13, wherein the magnetic bodies hold therebetween the common-mode choke coil in the coil portion.

15. The transmission line component according to claim 1, further comprising a common-mode choke coil element connected to the plurality of signal conductors and mounted on the substrate.

16. The transmission line component according to claim 1, wherein
the substrate includes a plurality of the coil portions and a plurality of the signal line portions;
the plurality of coil portions and the plurality of signal line portions are alternately provided;
a width of signal conductors in the plurality of coil portions is smaller than a width of signal conductors in the plurality of signal line portions; and
a distance between the signal conductors in the plurality of coil portions is smaller than a distance between the signal conductors in the plurality of signal line portions.

17. The transmission line component according to claim 16, wherein a difference between a characteristic impedance of the plurality of signal line portions for a differential-mode radio frequency signal and a characteristic impedance of the plurality of coil portions for a differential-mode radio frequency signal is smaller than a difference between a characteristic impedance of the plurality of signal line portions for a common-mode radio frequency signal and a characteristic impedance of the plurality of coil portions for a common-mode radio frequency signal.

18. The transmission line component according to claim 16, wherein a length of the plurality of signal line portions in the first direction is greater than a length of the plurality of coil portions in the first direction.

19. The transmission line component according to claim 16, wherein
two end portions of the plurality of signal line portions are tapered; and
a length of each of the two end portions of the plurality of signal line portions in the first direction is less than or equal to about ¼ of a length of the plurality of coil portions in the first direction.

20. An electronic device comprising:
a transmission line component, and another member to which the transmission line component is attached; wherein
the transmission line component includes:
a substrate that with a shape extending in a first direction and including an insulating material;
a plurality of signal conductors on or in the substrate; and
a common-mode choke coil including a coupling between the plurality of signal conductors;
the substrate includes:
a coil portion in which the common-mode choke coil is provided; and
a signal line portion in which the coupling between the plurality of signal conductors is weaker than the common-mode choke coil; and
the another member includes a step on a surface at which the transmission line component is attached.

21. The electronic device according to claim 20, wherein
the signal line portion includes a bent portion bent in a thickness direction of the substrate; and
the transmission line component is provided so that the bent portion extends along the step.

22. A transmission line component comprising:
a substrate with a shape extending in a first direction, and including an insulating material;
a first signal conductor and a second signal conductor on or in the substrate and extending in parallel or substantially in parallel to the first direction;
a common-mode choke coil including a first coil conductor connected to the first signal conductor and a second coil conductor connected to the second signal conductor; wherein
the substrate includes:
a coil portion in which common-mode choke coil is provided; and
a signal line portion in which a distance between the first signal conductor and the second signal conductor is greater than a distance between the first coil conductor and the second coil conductor.

23. The transmission line component according to claim 22, wherein the signal line portion includes a bent portion bent in a thickness direction of the substrate.

* * * * *